(12) United States Patent
Wu et al.

(10) Patent No.: US 10,608,604 B2
(45) Date of Patent: Mar. 31, 2020

(54) WIRELESS COMMUNICATIONS CIRCUIT AND ASSOCIATED WIRELESS COMMUNICATIONS DEVICE WITH REDUCED POWER LOSS AND REDUCED CIRCUIT AREA

(71) Applicant: MEDIATEK INC., Hsin-Chu (TW)

(72) Inventors: Chao-Liang Wu, Hsin-Chu (TW); Chung-Yu Hung, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/504,359

(22) Filed: Jul. 8, 2019

(65) Prior Publication Data

US 2020/0014346 A1    Jan. 9, 2020

Related U.S. Application Data

(60) Provisional application No. 62/695,291, filed on Jul. 9, 2018.

(51) Int. Cl.
*H03F 3/24*      (2006.01)
*H04B 1/40*      (2015.01)

(52) U.S. Cl.
CPC ............... *H03F 3/24* (2013.01); *H04B 1/40* (2013.01); *H03F 2200/294* (2013.01)

(58) Field of Classification Search
CPC ........ H03F 3/24; H03F 2200/294; H04B 1/40

USPC .......................................................... 455/73
See application file for complete search history.

(56) References Cited

U.S. PATENT DOCUMENTS

| | | | |
|---|---|---|---|
| 10,014,889 B2* | 7/2018 | King | H04B 1/40 |
| 10,075,199 B2* | 9/2018 | King | H04B 1/18 |
| 2007/0286306 A1* | 12/2007 | Dahlfeld | H04B 1/006 375/295 |
| 2013/0237260 A1* | 9/2013 | Lin | H04B 1/525 455/501 |
| 2017/0163295 A1* | 6/2017 | Talty | H04B 1/1036 |
| 2017/0279479 A1* | 9/2017 | Adams | H04B 1/0483 |
| 2018/0294858 A1* | 10/2018 | Pehlke | H04B 1/0057 |
| 2019/0199327 A1* | 6/2019 | Huang | H03H 11/1217 |

\* cited by examiner

*Primary Examiner* — David Bilodeau
(74) *Attorney, Agent, or Firm* — Winston Hsu

(57) ABSTRACT

A wireless communications circuit and an associated wireless communications device are provided. The wireless communications circuit may include a power amplifier with integrated filter (PAMiF) module and a two-stage switch module, and the two-stage switch module may include a first switch and a second switch. For example, a first port of the first switch is coupled to a filter port of the PAMiF module, and a second port of the first switch at an opposite side to the first port of the first switch is coupled to a first antenna. In addition, a first port of the second switch is coupled to a third port of the first switch at the opposite side to the first port of the first switch, and a second port of the second switch is coupled to a second antenna.

16 Claims, 4 Drawing Sheets

WIRELESS COMMUNICATIONS CIRCUIT AND ASSOCIATED WIRELESS COMMUNICATIONS DEVICE WITH REDUCED POWER LOSS AND REDUCED CIRCUIT AREA

CROSS REFERENCE TO RELATED APPLICATIONS

This application claims the benefit of U.S. Provisional Application No. 62/695,291, which was filed on Jul. 9, 2018, and is included herein by reference.

BACKGROUND

The present invention relates to communications systems, and more particularly, to a wireless communications circuit and an associated wireless communications device.

An electronic device that is equipped with wireless communications function (e.g. multifunctional mobile phone) may be designed to perform various communications operations to provide the user with certain network services. More particularly, the electronic device may be further designed to conform to newer specifications to provide better services. However, some problems such as some side effects may occur. For example, when the new architecture corresponding to the newer specifications is applied to the electronic device, the power loss and the circuit area may significantly increase. The increased circuit area may cause the associated costs to increase correspondingly. In addition, a new power design corresponding to a larger battery may be required, which may cause the associated costs to further increase. Thus, a novel architecture is required to guarantee the overall performance.

SUMMARY

It is an objective of the claimed invention to provide a wireless communications circuit and an associated wireless communications device, in order to solve the above-mentioned problems.

It is another objective of the claimed invention to provide a wireless communications circuit and an associated wireless communications device, in order to reduce power loss and the circuit area and enhance the overall performance.

According to at least one preferred embodiment, a wireless communications circuit is provided. The wireless communications circuit may comprise a power amplifier with integrated filter (PAMiF) module and a two-stage switch module, and the two-stage switch module may comprise a first switch and a second switch. For example, a first port of the first switch is coupled to a filter port of the PAMiF module, and a second port of the first switch at an opposite side to the first port of the first switch is coupled to a first antenna. In addition, a first port of the second switch is coupled to a third port of the first switch at the opposite side to the first port of the first switch, and a second port of the second switch is coupled to a second antenna.

According to at least one preferred embodiment, a wireless communications device is provided. The wireless communications device may comprise a baseband circuit, at least one transceiver coupled to the baseband circuit, and a plurality of wireless communications circuits coupled to the aforementioned at least one transceiver, wherein each wireless communications circuit of the plurality of wireless communications circuits may comprise a PAMiF module and a two-stage switch module, and the two-stage switch module may comprise a first switch and a second switch. For example, a first port of the first switch is coupled to a filter port of the PAMiF module, and a second port of the first switch at an opposite side to the first port of the first switch is coupled to a first antenna. In addition, a first port of the second switch is coupled to a third port of the first switch at the opposite side to the first port of the first switch, and a second port of the second switch is coupled to a second antenna.

It is an advantage of the present invention that the present invention apparatus (e.g. the wireless communications circuit and the wireless communications device) can enhance the overall performance. In comparison with the related art, the present invention apparatus can reduce the power loss and the circuit area.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 1:
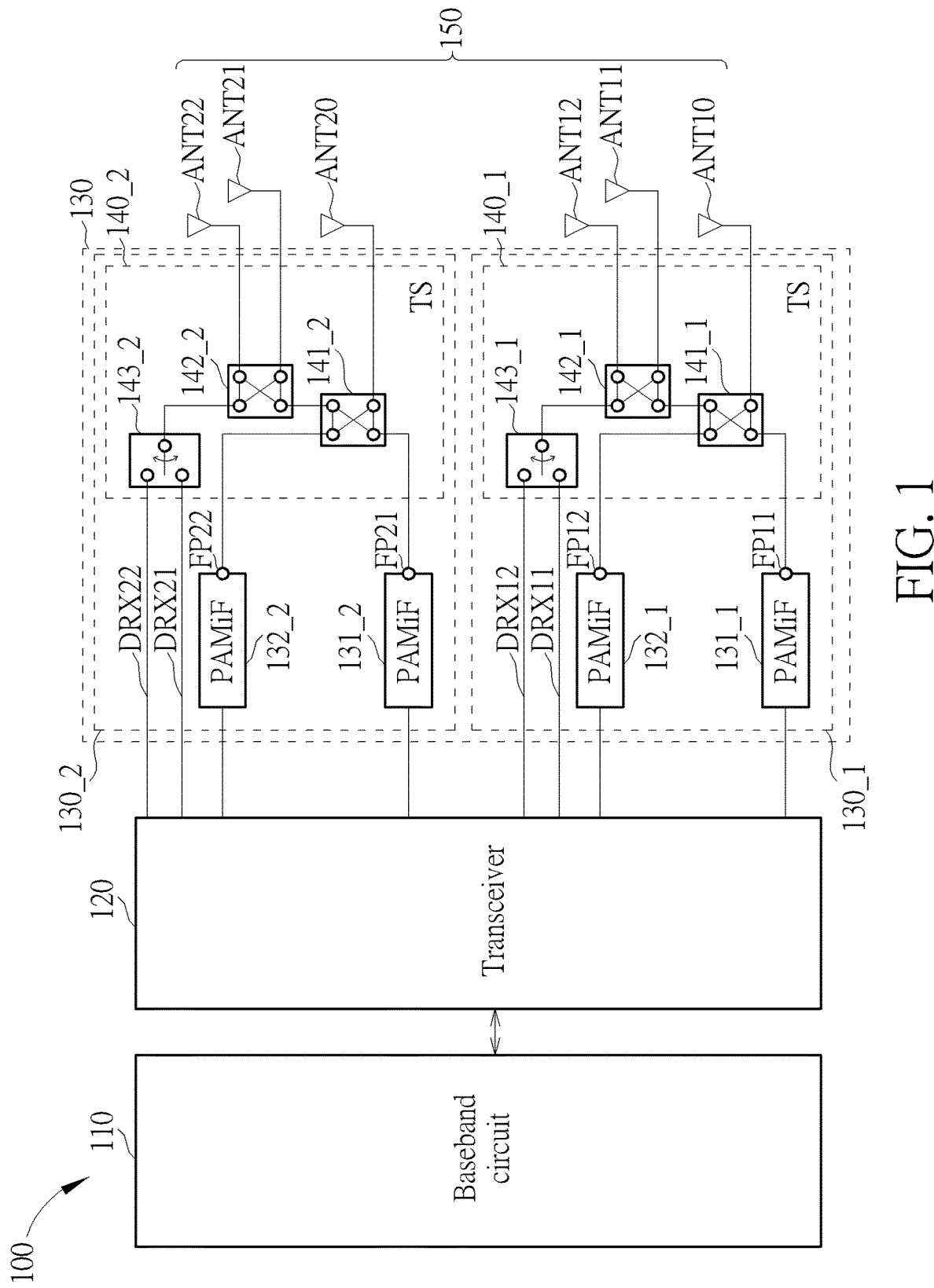
FIG. 1 is a diagram of a wireless communications device according to an embodiment of the present invention.

FIG. 1 is a diagram of a wireless communications device 100 according to an embodiment of the present invention. The wireless communications device 100 may comprise a baseband circuit 110, at least one transceiver (e.g. one or more transceivers) coupled to the baseband circuit 110, such as the transceiver 120, and a plurality of wireless communications circuits 130 coupled to the aforementioned at least one transceiver, such as the wireless communications circuits 130_1 and 130_2, and may further comprise a plurality of antennas 150. More particularly, the baseband circuit 110 and the transceiver 120 may be implemented as a baseband integrated circuit (IC) and a radio frequency IC (RFIC), respectively. Examples of the wireless communications device 100 may include, but not limited to, a mobile phone (e.g. a multifunctional mobile phone), tablet, and a personal computer such as a laptop computer.

As shown in FIG. 1, each wireless communications circuit of the plurality of wireless communications circuits 130, such as any of the wireless communications circuits 130_1 and 130_2, may comprise multiple power amplifier with integrated filter (PAMiF) modules and a two-stage switch module (respectively labeled "PAMiF" and "TS" in FIG. 1, for brevity), and the two-stage switch module may comprise a multiple switches. For example, the wireless communications circuit 130_1 may comprise the PAMiF modules 131_1 and 132_1 and the two-stage switch module 140_1, and the two-stage switch module 140_1 may comprise multiple switches such as the first switch 141_1, the second switch 142_1, and the third switch 143_1. The wireless communications circuit 130_2 may comprise the PAMiF modules 131_2 and 132_2 and the two-stage switch module 140_2, and the two-stage switch module 140_2 may comprise multiple switches such as the first switch 141_2, the second switch 142_2, and the third switch 143_2. In addition, the plurality of antennas 150 may comprise a first set of antennas such as a first antenna ANT10, a second antenna ANT11 and a third antenna ANT12, and may comprise a second set of antennas such as a first antenna ANT20, a second antenna ANT21 and a third antenna ANT22. According to this embodiment, the plurality of wireless communications circuits 130 (e.g. the wireless communications circuits 130_1 and 130_2) may be a plurality of IC products of the same model, and any two PAMiF modules within the PAMiF modules 131_1, 132_1, 131_2, and 132_2 may be equivalent to each other, but the present invention is not limited thereto.

Regarding the wireless communications circuit 130_1, a first port of the first switch 141_1 (e.g. the lower left port thereof) is coupled to a filter port FP11 of the PAMiF module 131_1, and a second port of the first switch 141_1 (e.g. the lower right port thereof) at the opposite side to the first port of the first switch 141_1 is coupled to the first antenna ANT10. In addition, a first port of the second switch 142_1 (e.g. the lower left port thereof) is coupled to a third port of the first switch 141_1 (e.g. the upper right port thereof) at the opposite side to the first port of the first switch 141_1, and a second port of the second switch 142_1 (e.g. the lower right port thereof) at the opposite side to the first port of the second switch 142_1 is coupled to the second antenna ANT11. Please note that a fourth port of the first switch 141_1 (e.g. the upper left port thereof) at the same side as the first port of the first switch 141_1 is coupled to a filter port FP12 of the PAMiF module 132_1. Additionally, a first port of the third switch 143_1 (e.g. the lower left port thereof) is coupled to a first return path DRX11, a second port of the third switch 143_1 (e.g. the upper left port thereof) at the same side as the first port of the third switch 143_1 is coupled to a second return path DRX12, and a third port of the third switch 143_1 (e.g. the right side port thereof) at the opposite side to the first port of the third switch 143_1 is coupled to a third port of the second switch 142_1 (e.g. the upper left port thereof) at the same side as the first port of the second switch 142_1. As shown in FIG. 1, a fourth port of the second switch 142_1 (e.g. the upper right port thereof) at the opposite side to the first port of the second switch 142_1 is coupled to the third antenna ANT12. For better comprehension, the first switch 141_1 and the third switch 143_1 may belong to a first stage of the two-stage switch module 140_1, and the second switch 142_1 may belong to a second stage of the two-stage switch module 140_1.

For example, the first switch 141_1 may comprise at least one internal path (e.g. one or more internal paths) that is switchable to couple at least the first port of the first switch 141_1 (e.g. the lower left port thereof) to one of the second and the third ports of the first switch 141_1 (e.g. any of the lower right port and the upper right port thereof). More particularly, the first switch 141_1 may comprise at least one internal path (e.g. one or more internal paths) that is switchable to couple one of the first and the fourth ports of the first switch 141_1 (e.g. any of the lower left port and the upper left port thereof) to one of the second and the third ports of the first switch 141_1 (e.g. any of the lower right port and the upper right port thereof). In addition, the third switch 143_1 may comprise at least one internal path (e.g. one or more internal paths) that is switchable to couple one of the first and the second ports of the third switch 143_1 (e.g. any of the lower left port and the upper left port thereof) to the third port of the third switch (e.g. the right side port thereof), and the second switch 142_1 may comprise at least one internal path (e.g. one or more internal paths) that is switchable to couple one of the first and the third ports of the second switch 142_1 (e.g. any of the lower left port and the upper left port thereof) to at least the second port of the second switch 142_1 (e.g. the lower right port thereof). More particularly, the second switch 142_1 may comprise at least one internal path (e.g. one or more internal paths) that is switchable to couple one of the first and the third ports of the second switch 142_1 (e.g. any of the lower left port and the upper left port thereof) to one of the second and the fourth ports of the second switch 142_1 (e.g. any of the lower right port and the upper right port thereof).

Regarding the wireless communications circuit 130_2, a first port of the first switch 141_2 (e.g. the lower left port thereof) is coupled to a filter port FP21 of the PAMiF module 131_2, and a second port of the first switch 141_2 (e.g. the lower right port thereof) at the opposite side to the first port of the first switch 141_2 is coupled to the first antenna ANT20. In addition, a first port of the second switch 142_2 (e.g. the lower left port thereof) is coupled to a third port of the first switch 141_2 (e.g. the upper right port thereof) at the opposite side to the first port of the first switch 141_2, and a second port of the second switch 142_2 (e.g. the lower right port thereof) at the opposite side to the first port of the second switch 142_2 is coupled to the second antenna ANT21. Please note that a fourth port of the first switch 141_2 (e.g. the upper left port thereof) at the same side as the first port of the first switch 141_2 is coupled to a filter port FP22 of the PAMiF module 132_2. Additionally, a first port of the third switch 143_2 (e.g. the lower left port thereof) is coupled to a first return path DRX21, a second port of the third switch 143_2 (e.g. the upper left port thereof) at the same side as the first port of the third switch 143_2 is coupled to a second return path DRX22, and a third port of the third switch 143_2 (e.g. the right side port thereof) at the opposite side to the first port of the third switch 143_2 is coupled to a third port of the second switch 142_2 (e.g. the upper left port thereof) at the same side as the first port of the second switch 142_2. As shown in FIG. 1, a fourth port of the second switch 142_2 (e.g. the upper right port thereof) at the opposite side to the first port of the second switch 142_2 is coupled to the third antenna ANT22. For better comprehension, the first switch 141_2 and the third switch 143_2 may belong to a first stage of the two-stage switch module 140_2, and the second switch 142_2 may belong to a second stage of the two-stage switch module 140_2.

For example, the first switch 141_2 may comprise at least one internal path (e.g. one or more internal paths) that is switchable to couple at least the first port of the first switch 141_2 (e.g. the lower left port thereof) to one of the second and the third ports of the first switch 141_2 (e.g. any of the lower right port and the upper right port thereof). More particularly, the first switch 141_2 may comprise at least one internal path (e.g. one or more internal paths) that is switchable to couple one of the first and the fourth ports of the first switch 141_2 (e.g. any of the lower left port and the upper left port thereof) to one of the second and the third ports of the first switch 141_2 (e.g. any of the lower right port and the upper right port thereof). In addition, the third switch 143_2 may comprise at least one internal path (e.g. one or more internal paths) that is switchable to couple one of the first and the second ports of the third switch 143_2 (e.g. any of the lower left port and the upper left port thereof) to the third port of the third switch (e.g. the right side port thereof), and the second switch 142_2 may comprise at least one internal path (e.g. one or more internal paths) that is switchable to couple one of the first and the third ports of the second switch 142_2 (e.g. any of the lower left port and the upper left port thereof) to at least the second port of the second switch 142_2 (e.g. the lower right port thereof). More particularly, the second switch 142_2 may comprise at least one internal path (e.g. one or more internal paths) that is switchable to couple one of the first and the third ports of the second switch 142_2 (e.g. any of the lower left port and the upper left port thereof) to one of the second and the fourth ports of the second switch 142_2 (e.g. any of the lower right port and the upper right port thereof).

According to this embodiment, each of the PAMiF modules 131_1, 132_1, 131_2, and 132_2 may perform amplification and filtering for the aforementioned at least one transceiver such as the transceiver 120, and the two-stage switch modules 140_1 and 140_2 may perform signal switching for the first set of antennas ANT10, ANT11 and ANT12 and the second set of antennas ANT20, ANT21 and ANT22, respectively, but the present invention is not limited thereto.

Based on the architecture shown in FIG. 1, the circuitry arrangement may be very compact. For example, each of the PAMiF modules 131_1, 132_1, 131_2, and 132_2 may be implemented on a die, each of the two-stage switch modules 140_1 and 140_2 may be implemented on a die, and each of the plurality of wireless communications circuits 130 (e.g. any of the wireless communications circuits 130_1 and 130_2) may be implemented as an IC product, but the present invention is not limited thereto. As a result, the present invention apparatus (e.g. the wireless communications circuits and the wireless communications device) can enhance the overall performance. In comparison with the related art, the present invention apparatus can reduce the power loss and the circuit area.

Figure 2:
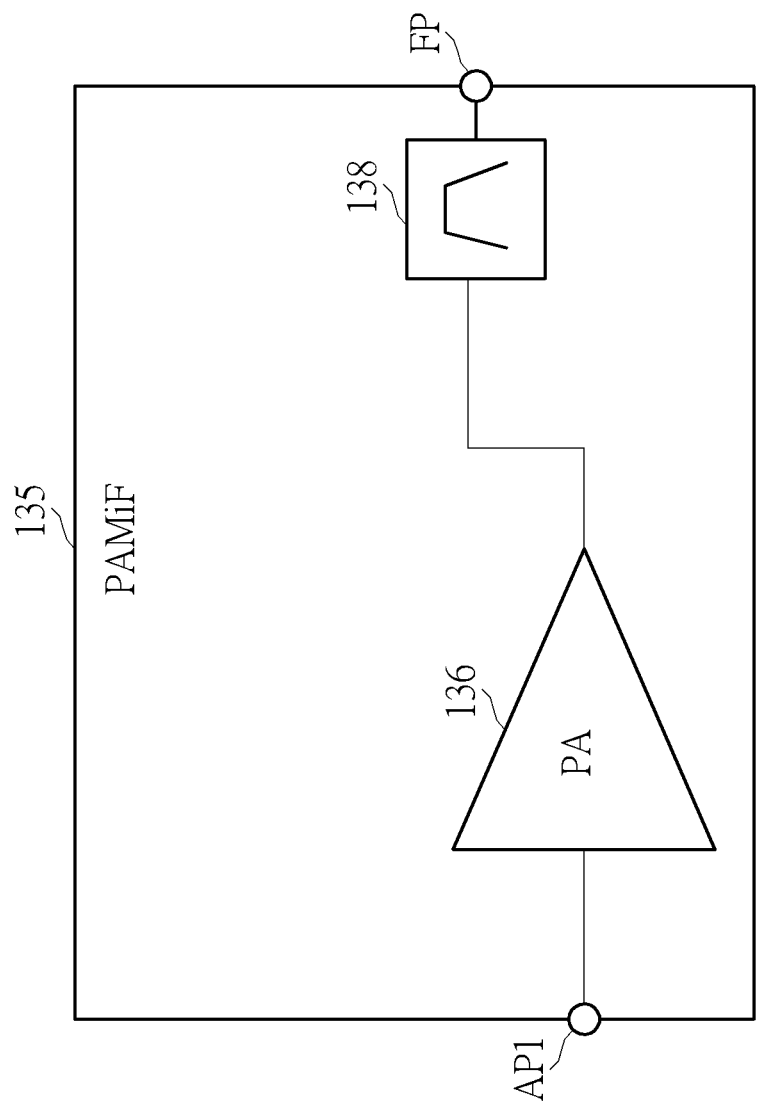
FIG. 2 illustrates some implementation details of the wireless communications device shown in FIG. 1 according to an embodiment of the present invention.

FIG. 2 illustrates some implementation details of the wireless communications device 100 shown in FIG. 1 according to an embodiment of the present invention. The PAMiF module 135 shown in FIG. 2 may be taken as an example of each of the PAMiF modules 131_1, 132_1, 131_2, and 132_2 shown in FIG. 1. The PAMiF module 135 may comprise a power amplifier (PA) 136 and a filter 138, and may further comprise an amplifier port AP1 and a filter port FP. The amplifier port AP1 may be coupled to the transceiver 120 shown in FIG. 1, and the filter port FP may be coupled to one of the first switches 141_1 and 141_2 shown in FIG. 1. For example, the PAMiF module 135 may represent a certain PAMiF module within the PAMiF modules 131_1, 132_1, 131_2, and 132_2, and the filter port FP may represent the filter port of this PAMiF module (e.g. the corresponding filter port such as one of the filter ports FP11, FP12, FP21, and FP22 shown in FIG. 1). For brevity, similar descriptions for this embodiment are not repeated in detail here.

Figure 3:
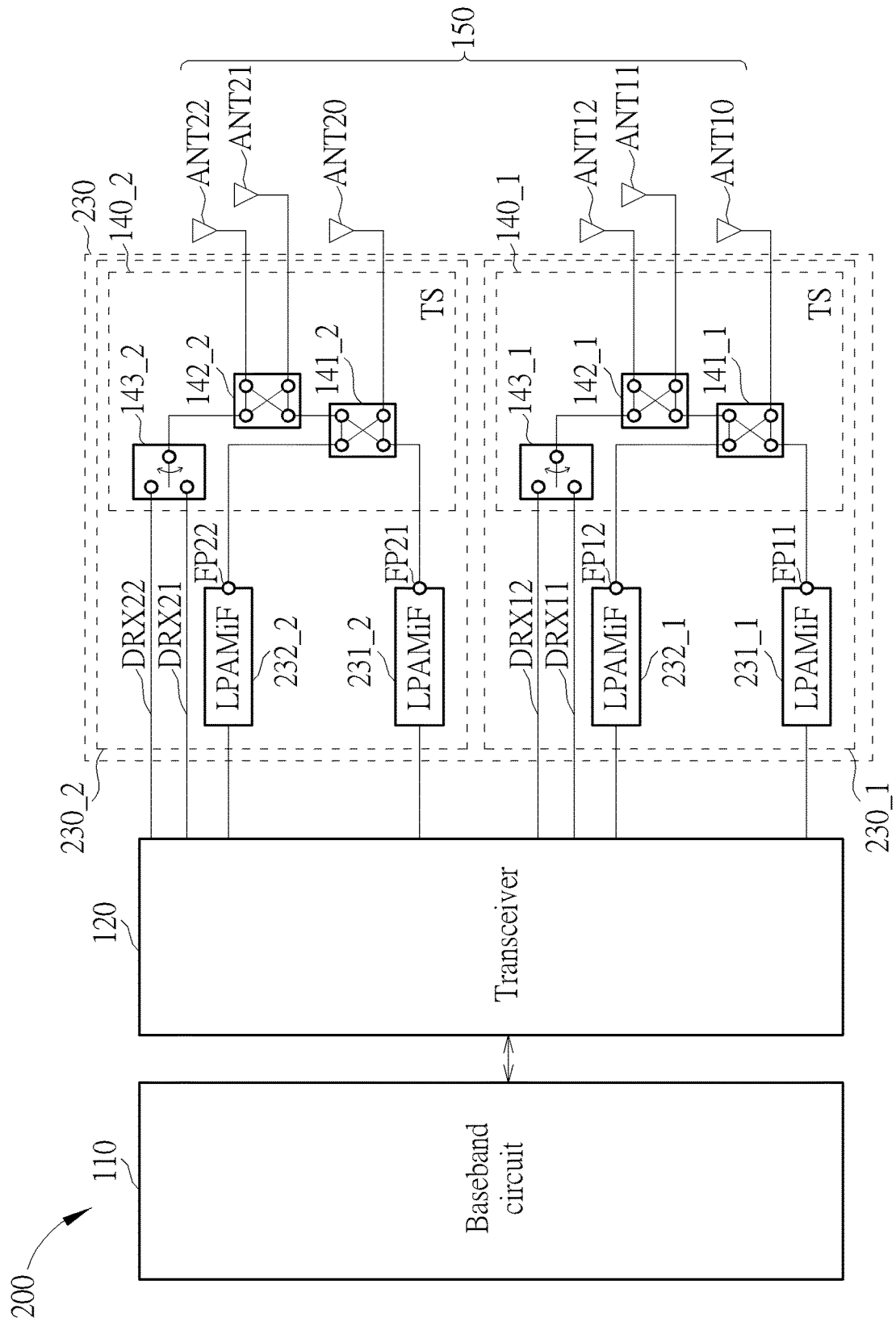
FIG. 3 is a diagram of a wireless communications device according to another embodiment of the present invention.

FIG. 3 is a diagram of a wireless communications device 200 according to another embodiment of the present invention. The architecture shown in FIG. 3 may be implemented by changing the architecture shown in FIG. 1, and more particularly, by replacing the PAMiF modules 131_1, 132_1, 131_2, and 132_2 with a plurality of low noise amplifier and power amplifier with integrated filter (LPAMiF) modules 231_1, 232_1, 231_2, and 232_2, respectively. In response to the above change in the architecture, the numerals for indicating some components may be changed correspondingly, where the plurality of wireless communications circuits 230 (e.g. the wireless communications circuits 230_1 and 230_2) and the wireless communications device 200 shown in FIG. 3 may replace the plurality of wireless communications circuits 130 (e.g. the wireless communications circuits 130_1 and 130_2) and the wireless communications device 100 shown in FIG. 1, respectively. For brevity, similar descriptions for this embodiment are not repeated in detail here.

Figure 4:
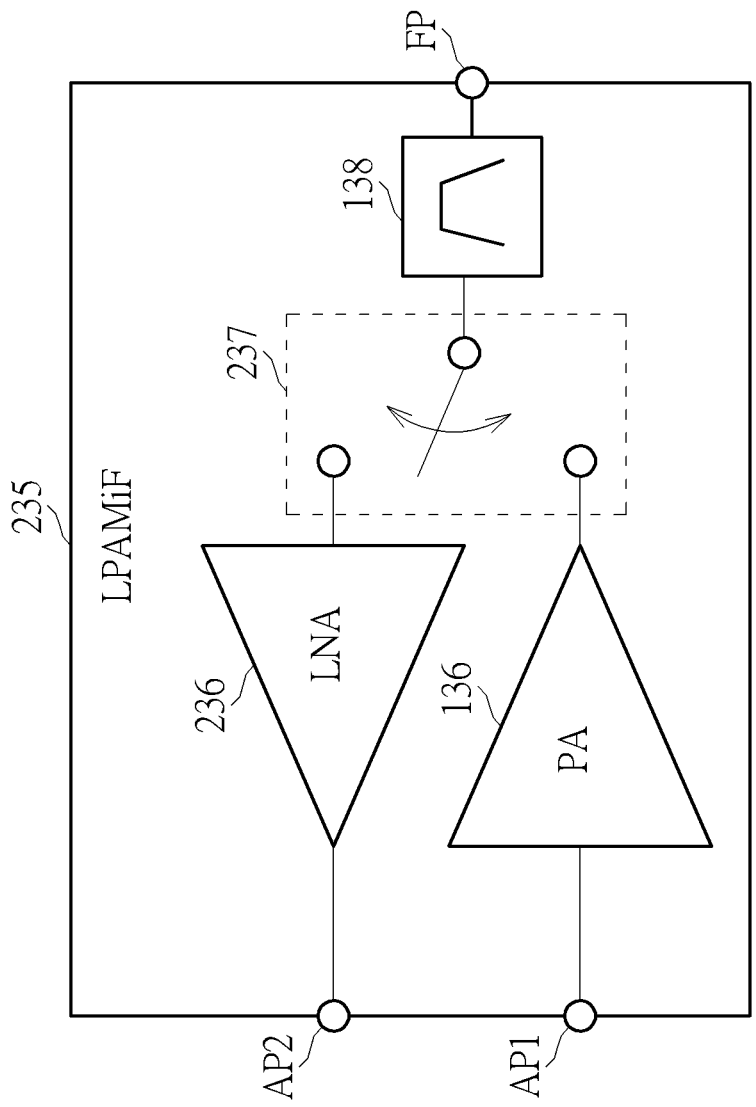
FIG. 4 illustrates some implementation details of the wireless communications device shown in FIG. 3 according to an embodiment of the present invention.

FIG. 4 illustrates some implementation details of the wireless communications device 200 shown in FIG. 3 according to an embodiment of the present invention. The LPAMiF module 235 shown in FIG. 4 may be taken as an example of each of the LPAMiF modules 231_1, 232_1, 231_2, and 232_2 shown in FIG. 3. In addition to the PA 136, the filter 138, the amplifier port AP1 and the filter port FP of the PAMiF module 135 shown in FIG. 2, the LPAMiF module 235 may further comprise a low noise amplifier (LNA) 236, a switch 237, and an amplifier port AP2. The amplifier ports AP1 and AP2 may be coupled to the transceiver 120 shown in FIG. 3, and the filter port FP may be coupled to one of the first switches 141_1 and 141_2 shown in FIG. 3. For example, the LPAMiF module 235 may represent a certain LPAMiF module within the LPAMiF modules 231_1, 232_1, 231_2, and 232_2, and the filter port FP may represent the filter port of this LPAMiF module (e.g. the corresponding filter port such as one of the filter ports FP11, FP12, FP21, and FP22 shown in FIG. 3). For brevity, similar descriptions for this embodiment are not repeated in detail here.

According to some embodiments, as the LPAMiF module 235 shown in FIG. 4 comprises the PA 136, the filter 138, the amplifier port AP1 and the filter port FP of the PAMiF module 135 shown in FIG. 2, the LPAMiF module 235 may be regarded as a PAMiF module (e.g. the PAMiF module 135) equipped with additional architecture (e.g. the LNA 236, the switch 237, and the amplifier port AP2), and therefore may belong to a type of PAMiF modules. In addition, as the LPAMiF module 235 shown in FIG. 4 may be taken as an example of each of the LPAMiF modules 231_1, 232_1, 231_2, and 232_2 shown in FIG. 3, the LPAMiF modules 231_1, 232_1, 231_2, and 232_2 may be regarded as PAMiF modules equipped with additional architecture, respectively, and may belong to the type of PAMiF modules. For brevity, similar descriptions for these embodiments are not repeated in detail here.

According to some embodiments, the PAMiF modules 131_1, 132_1, 131_2, and 132_2 shown in FIG. 1 may be implemented to be LPAMiF modules such as the LPAMiF modules 231_1, 232_1, 231_2, and 232_2 shown in FIG. 3, respectively. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless communications circuit, comprising:
   a power amplifier with integrated filter (PAMiF) module; and
   a two-stage switch module, comprising:
      a first switch, wherein a first port of the first switch is coupled to a filter port of the PAMiF module, and a second port of the first switch at an opposite side to the first port of the first switch is coupled to a first antenna; and
      a second switch, wherein a first port of the second switch is coupled to a third port of the first switch at the opposite side to the first port of the first switch, and a second port of the second switch is coupled to a second antenna.

2. The wireless communications circuit of claim 1, further comprising:
   another PAMiF module, wherein a fourth port of the first switch at a same side as the first port of the first switch is coupled to a filter port of the other PAMiF module.

3. The wireless communications circuit of claim 2, wherein the first switch comprises at least one internal path that is switchable to couple one of the first and the fourth ports of the first switch to one of the second and the third ports of the first switch.

4. The wireless communications circuit of claim 1, wherein the first switch comprises at least one internal path that is switchable to couple at least the first port of the first switch to one of the second and the third ports of the first switch.

5. The wireless communications circuit of claim 1, wherein the two-stage switch module further comprises:
   a third switch, wherein a first port of the third switch is coupled to a first return path, a second port of the third switch at a same side as the first port of the third switch is coupled to a second return path, and a third port of the third switch at an opposite side to the first port of the third switch is coupled to a third port of the second switch at a same side as the first port of the second switch.

6. The wireless communications circuit of claim 5, wherein the third switch comprises at least one internal path that is switchable to couple one of the first and the second ports of the third switch to the third port of the third switch; and the second switch comprises at least one internal path that is switchable to couple one of the first and the third ports of the second switch to at least the second port of the second switch.

7. The wireless communications circuit of claim 1, wherein the PAMiF module is implemented to be a low noise amplifier and power amplifier with integrated filter (LPAMiF) module.

8. A wireless communications device comprising the wireless communications circuit of claim 1, wherein the wireless communications device further comprises:
   a baseband circuit; and
   at least one transceiver, coupled to the baseband circuit, wherein the wireless communications circuit is coupled to said at least one transceiver.

9. The wireless communications device of claim 8, wherein the wireless communications device comprises:
   a plurality of wireless communications circuits comprising the wireless communications circuit, coupled to said at least one transceiver, wherein the plurality of wireless communications circuits are a plurality of integrated circuit (IC) products of a same model.

10. A wireless communications device, comprising:
    a baseband circuit;
    at least one transceiver, coupled to the baseband circuit; and
    a plurality of wireless communications circuits, coupled to said at least one transceiver, wherein each wireless communications circuit of the plurality of wireless communications circuits comprises:
       a power amplifier with integrated filter (PAMiF) module; and
       a two-stage switch module, comprising:
          a first switch, wherein a first port of the first switch is coupled to a filter port of the PAMiF module, and a second port of the first switch at an opposite side to the first port of the first switch is coupled to a first antenna; and
          a second switch, wherein a first port of the second switch is coupled to a third port of the first switch at the opposite side to the first port of the first switch, and a second port of the second switch is coupled to a second antenna.

11. The wireless communications device of claim 10, wherein the wireless communications circuit further comprises:
    another PAMiF module, wherein a fourth port of the first switch at a same side as the first port of the first switch is coupled to a filter port of the other PAMiF module.

12. The wireless communications device of claim 11, wherein the first switch comprises at least one internal path that is switchable to couple one of the first and the fourth ports of the first switch to one of the second and the third ports of the first switch.

13. The wireless communications device of claim 10, wherein the first switch comprises at least one internal path that is switchable to couple at least the first port of the first switch to one of the second and the third ports of the first switch.

14. The wireless communications device of claim 10, wherein the two-stage switch module further comprises:
    a third switch, wherein a first port of the third switch is coupled to a first return path, a second port of the third switch at a same side as the first port of the third switch is coupled to a second return path, and a third port of the third switch at an opposite side to the first port of the third switch is coupled to a third port of the second switch at a same side as the first port of the second switch.

15. The wireless communications device of claim 14, wherein the third switch comprises at least one internal path that is switchable to couple one of the first and the second ports of the third switch to the third port of the third switch; and the second switch comprises at least one internal path that is switchable to couple one of the first and the third ports of the second switch to at least the second port of the second switch.

16. The wireless communications device of claim 10, wherein the PAMiF module is implemented to be a low noise amplifier and power amplifier with integrated filter (LPAMiF) module.

* * * * *